US012106958B2

(12) United States Patent
Singh et al.

(10) Patent No.: US 12,106,958 B2
(45) Date of Patent: Oct. 1, 2024

(54) METHOD OF USING DUAL FREQUENCY RF POWER IN A PROCESS CHAMBER

(71) Applicant: Applied Materials, Inc., Santa Clara, CA (US)

(72) Inventors: Anup Kumar Singh, Santa Clara, CA (US); Rick Kustra, San Jose, CA (US); Vinayak Vishwanath Hassan, San Francisco, CA (US); Bhaskar Kumar, San Jose, CA (US); Krishna Nittala, San Jose, CA (US); Pramit Manna, Santa Clara, CA (US); Kaushik Alayavalli, Sunnyvale, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/342,296

(22) Filed: Jun. 27, 2023

(65) Prior Publication Data

US 2023/0343586 A1 Oct. 26, 2023

Related U.S. Application Data

(62) Division of application No. 17/035,107, filed on Sep. 28, 2020, now Pat. No. 11,721,545.

(51) Int. Cl.
*H01L 21/02* (2006.01)
*B08B 7/00* (2006.01)
(Continued)

(52) U.S. Cl.
CPC ...... *H01L 21/02274* (2013.01); *B08B 7/0035* (2013.01); *C23C 16/26* (2013.01);
(Continued)

(58) Field of Classification Search
None
See application file for complete search history.

(56) References Cited

U.S. PATENT DOCUMENTS 7,658,969 B2 2/2010 Kumar et al.
2015/0228463 A1 8/2015 Manna et al.
(Continued)

FOREIGN PATENT DOCUMENTS

JP 2007-533848 A 11/2007
KR 1020130118880 A 10/2013
WO 2014149175 A1 9/2014

OTHER PUBLICATIONS

International Search Report/Written Opinion issued to PCT/US2021/050681 on Jan. 4, 2022.

*Primary Examiner* — Asok K Sarkar
(74) *Attorney, Agent, or Firm* — Patterson+Sheridan, LLP.

(57) ABSTRACT

Embodiments of the present disclosure generally relate to methods for cleaning a chamber comprising introducing a gas to a processing volume of the chamber, providing a first radiofrequency (RF) power having a first frequency of about 40 MHz or greater to a lid of the chamber, providing a second RF power having a second frequency to an electrode disposed in a substrate support within the processing volume, and removing at least a portion of a film disposed on a surface of a chamber component of the chamber. The second frequency is about 10 MHz to about 20 MHz.

20 Claims, 4 Drawing Sheets

(51) Int. Cl.
*C23C 16/26* (2006.01)
*C23C 16/44* (2006.01)
*C23C 16/505* (2006.01)
*H01J 37/32* (2006.01)
*H01L 21/033* (2006.01)

(52) U.S. Cl.
CPC ........ *C23C 16/4405* (2013.01); *C23C 16/505* (2013.01); *H01J 37/32082* (2013.01); *H01J 37/3244* (2013.01); *H01J 37/32862* (2013.01); *H01L 21/02115* (2013.01); *H01L 21/0332* (2013.01)

(56) References Cited

U.S. PATENT DOCUMENTS

2016/0276150 A1\* 9/2016 Xue ................. H01L 21/76829
2020/0370177 A1 11/2020 Franklin et al.

\* cited by examiner

METHOD OF USING DUAL FREQUENCY RF POWER IN A PROCESS CHAMBER

CROSS-REFERENCE TO RELATED APPLICATIONS

This application is a divisional of co-pending U.S. patent application Ser. No. 17/035,107, filed Sep. 28, 2020, which is herein incorporated by reference.

BACKGROUND

Embodiments of the present disclosure generally relate to apparatus and methods used in the manufacture of semiconductor devices. More particularly, embodiments of the present disclosure relate to a substrate processing chamber, and components thereof, for forming semiconductor devices.

DESCRIPTION OF THE RELATED ART

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, there is a trend to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are often utilized. As critical dimensions (CD) decrease, current hardmask materials lack the desired etch selectivity relative to underlying materials (e.g., oxides and nitrides) and are often difficult to deposit. In order to produce hardmasks with increased thickness and good film properties, layers are deposited using multiple iterations with cleaning between each deposition. Such processes limit throughput and/or hardmask quality. Thus, what is needed in the art are improved methods and systems for forming hardmasks with increased thickness in a single shot deposition to increase the throughput.

SUMMARY

Embodiments of the present disclosure generally relate to systems and methods used in the manufacture of semiconductor devices. More particularly, embodiments of the present disclosure relate to a substrate processing chamber, and components thereof, for forming hardmasks for use in semiconductor devices.

In one embodiment, a method includes introducing a gas to a processing volume of a chamber. A first radiofrequency (RF) power is provided having a first frequency of about 40 MHz or greater to a lid of the chamber. A second RF power is provided having a second frequency to a bias electrode disposed in a substrate support within the processing volume. The second frequency is about 10 MHz to about 20 MHz.

In another embodiment, a method for cleaning a chamber includes introducing a gas to a processing volume of the chamber. A first radiofrequency (RF) power having a first frequency of about 40 MHz or greater is provided to a lid of the chamber. A second RF power having a second frequency is provided to an electrode disposed in a substrate support within the processing volume. The second frequency is about 10 MHz to about 20 MHz. At least a portion of a film disposed on a surface of a chamber component of the chamber is removed.

In another embodiment, a method of processing a substrate includes introducing a gas to a processing volume of a chamber. A first radiofrequency (RF) power having a first frequency of about 40 MHz to about 60 MHz is provided to a lid of the chamber. A second RF power having a second frequency is provided to an electrode disposed in a substrate support within the processing volume, wherein the second frequency is about 10 MHz to about 20 MHz. A film having a thickness of about 5 KÅ to about 3 µm is deposited on the substrate disposed on the substrate support and at least one surface of a chamber component.

BRIEF DESCRIPTION OF THE DRAWINGS

So that the manner in which the above recited features of the present disclosure can be understood in detail, a more particular description of the disclosure, briefly summarized above, can be had by reference to embodiments, some of which are illustrated in the appended drawings. It is to be noted, however, that the appended drawings illustrate only typical embodiments of this disclosure and are therefore not to be considered limiting of its scope, for the disclosure can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to a substrate processing chamber utilized in substrate processing in the manufacture of electronic devices. Substrate processing includes deposition processes, including low pressure processes, plasma processes, and thermal processes used to manufacture electronic devices on substrates. Examples of processing chambers and/or systems that may be adapted to benefit from exemplary aspects of the disclosure is the PIONEER™ PECVD system commercially available from Applied Materials, Inc., located in Santa Clara, California. It is contemplated that other processing chambers and/or processing platforms, including those from other manufacturers, may be adapted to benefit from aspects of the disclosure.

Figure 1:
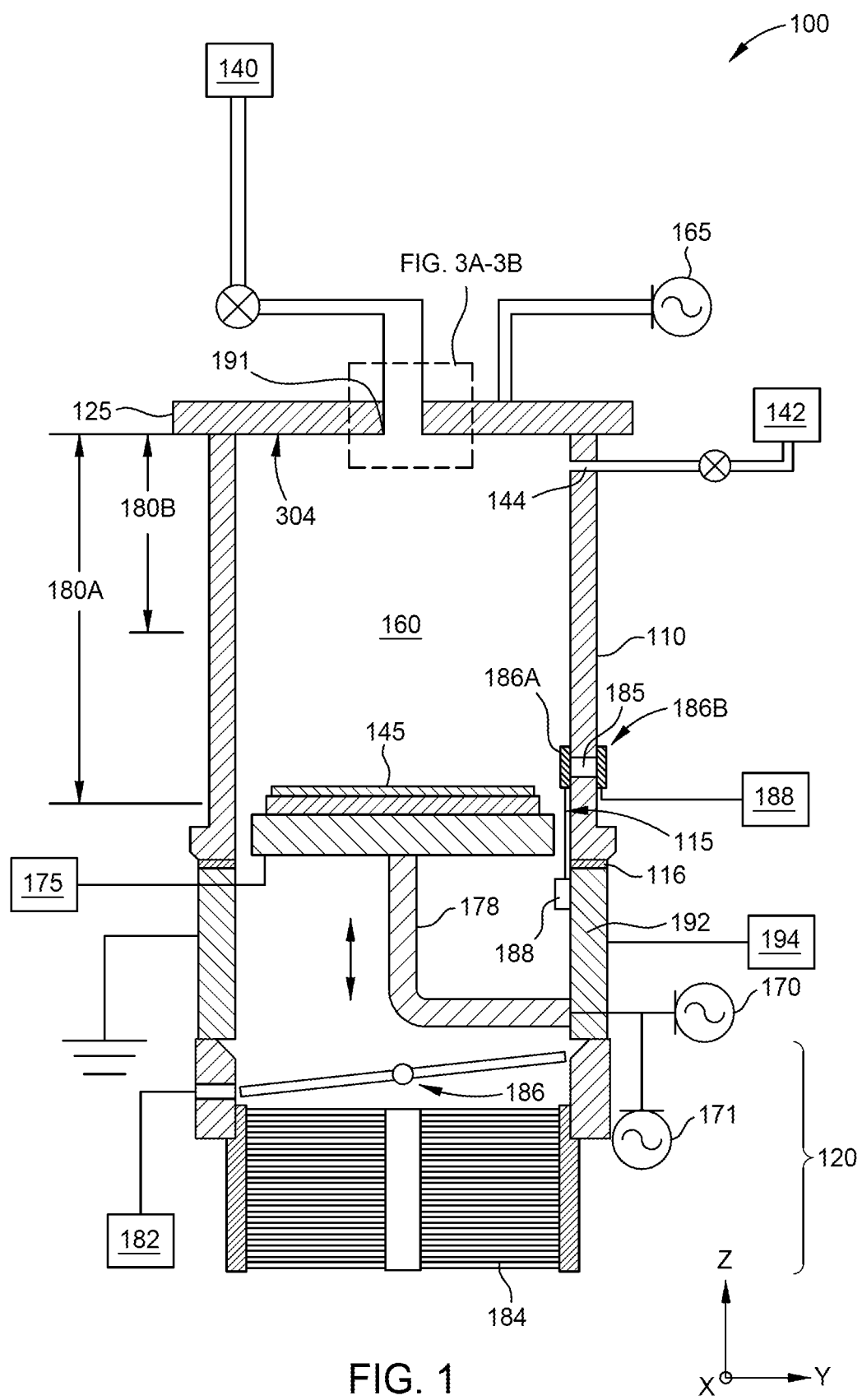
FIG. 1 is a schematic side cross sectional view of an illustrative processing chamber according to an embodiment.

FIG. 1 is a schematic side cross sectional view of an illustrative processing chamber 100 suitable for conducting a deposition process. In one embodiment, which can be combined with other embodiments described herein, the processing chamber 100 may be configured to deposit advanced patterning films onto a substrate, such as hardmask films, for example, amorphous carbon hardmask films.

The processing chamber 100 includes a lid 125, a spacer 110 disposed on a chamber body 192, a substrate support 115, and a variable pressure system 120. Although the lid 125 is depicted as flat in FIG. 1, in some embodiments, which can be combined with other embodiments described herein, the lid 125 is dome-shaped.

The lid 125 is coupled to a first processing gas source 140. The first processing gas source 140 contains precursor gases for forming films on a substrate 145 supported on the substrate support 115. As an example, the first processing gas source 140 includes precursor gases such as carbon containing gases, hydrogen containing gases, and helium, among others. In a specific example, the carbon containing gas includes acetylene ($C_2H_2$). The first processing gas source 140 provides precursors gases through one or more channels 191 within the lid 125. The one or more channels 191 direct precursor gases from the first processing gas source 140 into a processing volume 160. In some embodiments, which can be combined with other embodiments described herein, a second processing gas source 142 is fluidly coupled to the processing volume 160 via an inlet 144 disposed through a gas ring with nozzles attached to the spacer 110, or through a chamber side wall. As an example, the second processing gas source 142 includes precursor gases such as carbon containing gases, hydrogen containing gases, and helium, among others, for example $C_2H_2$. In some embodiments, which can be combined with other embodiments described herein, a total flow rate of precursor gases into the processing volume 160 is about 100 sccm to about 2 slm. The flow of precursor gases in the processing volume 160 via the second processing gas source 142 are uniformly distributed in the processing volume 160. In one example, a plurality of inlets 144 may be radially distributed about the spacer 110 or about the chamber sidewall. In such an example, gas flow to each of the inlets 144 may be separately controlled to further facilitate gas uniformity within the processing volume 160.

The lid 125 is also coupled to a first or upper radio frequency (RF) power source 165. The first RF power source 165 facilitates maintenance or generation of plasma, such as a plasma generated from a cleaning gas. The cleaning gas is ionized into a plasma in situ via the first RF power source 165. The substrate support 115 is coupled to a second or lower RF power source 170. The first RF power source 165 is a medium to high frequency RF power source (for example, about 13.56 MHz to about 80 MHz such as 20 MHz to about 40 MHz. The second RF power source 170 may be a low or medium frequency RF power source (for example, about 400 kHz to about 27 MHz. It is to be noted that other frequencies are also contemplated. In some implementations, the second RF power source 170 is a mixed frequency RF power source, providing low and medium frequency or low and high frequency, such as a low frequency of 2 MHz or 400 kHz frequency power in combination with a 13.56 MHz frequency power, or low frequency of 2 MHz or 400 kHz frequency power in combination with a 40 MHz frequency power. Use of a dual frequency RF power source, particularly for the second RF power source 170 used for deposition, improves film quality on the substrate. The first RF power source 165 is used to clean the upper portion of processing volume, such as the lid. Without being bound by theory, it is believed that the plasma in upper portion of the processing volume near the lid is weak and hence the quality of the film in the upper portion is weak if only the second RF power source 170 is used for deposition. Using a dual frequency RF power source with first RF power source 165 enhances film quality on the lid. Enhanced film quality can be seen in scanning electron microscopy (SEM) imaging of cross sections of the film. In particular, the cross section of the film is amorphous, homogeneous and less porous. Better film quality is also evident in a reduced defect count on the substrates that would otherwise cause lower yield of device fabrication. These characteristics are indicative of a good quality film. Without being bound by theory it is believed that reduced quality carbon films have irregularities and defects caused by compressive stress which results in failures for films exceeding certain thicknesses such as greater than 3,000 Å, such as greater than 5,000 Å. Providing power from the first RF power source 165 at the top of the chamber reduces the DC bias voltage ($V_{dc}$) at the substrate support 115. Although the film quality at the surface 304 of the lid 125 is improved, the film quality of the film on the substrate is reduced. It has been discovered that the loss of $V_{dc}$ at substrate level 145 is compensated by using an additional independent power control from a low frequency power source (e.g., third RF power source 171) in combination with a medium or high frequency source (e.g., second RF power source 170) from the bias. The low frequency RF power source 171 gives an extra tunability to enhance the film properties on substrate. It has been found that low frequency power generators provide high $V_{dc}$ (e.g., high ion bombardment) to compensate for $V_{dc}$ loss due to the high frequency power of the first RF power source 165 which enables improvement of film quality on the lid surface while maintaining good film quality on the substrate. Thus, the low, dual frequency power provided by the second RF power source 170 and/or the third RF power source 171, as described herein enables good quality film deposition overall at lower total power.

One or both of the first RF power source 165 and the second RF power source 170 are utilized in creating or maintaining a plasma in the processing volume 160. For example, the second RF power source 170 may be utilized during a deposition process and the first RF power source 165 may be utilized during a cleaning process. In some deposition processes, the first RF power source 165 is used in conjunction with the second RF power source 170. During a deposition process, one or both of the first RF power source 165 and the second RF power source 170 provide a power of about 100 Watts (W) to about 20,000 W in the processing volume 160 to facilitation ionization of a precursor gas. In some embodiments, which can be combined with other embodiments described herein, during deposition, the first RF power source 165 provides a first power of about 200 W to about 5 KW, such as about 700 W to about 3 KW, such as about 1 KW to about 3 KW. The second RF power source 170 provides a second power of about 1000 W to about 6 KW, such as about 1500 W to about 4 KW. The third RF power source 171 provides a third power of about 500 W to about 5000 W.

In another embodiment, which can be combined with other embodiments described herein, the precursor gas includes helium and $C_2H_2$. In one embodiment, which can be combined with other embodiments described herein, $C_2H_2$ is provided at a flow rate of about 10 sccm to about 1,000 sccm and He is provided at a flow rate of about 50 sccm to about 5,000 sccm.

The substrate support 115 is coupled to an actuator 175 (i.e., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections. The spacer 110 is disposed on the chamber body 192. A height of the spacer 110 allows movement of the substrate support 115 vertically within the processing volume 160. The height of the spacer 110 is about 0.5 inches to about 20 inches. In one example, the substrate support 115 is movable from a first distance to a second distance relative to the lid 125. In one embodiment, the second distance is about ⅔ of the first distance 180A. For example, the difference between the first distance 180A and the second distance is about 5 inches to about 6 inches. Thus, from the position shown in FIG. 1, the substrate support 115 is movable by about 5 inches to about 6 inches relative to a lower surface of the lid 125. In another example, the substrate support 115 is fixed at one of the first distance 180A and the second distance 180B. In contrast to conventional plasma enhanced chemical vapor deposition (PECVD) processes, the spacer 110 greatly increases the distance between (and thus the volume between) the substrate support 115 and the lid 125.

The variable pressure system 120 includes a first pump 182 and a second pump 184. The first pump 182 is a roughing pump that may be utilized during a cleaning process and/or substrate transfer process. A roughing pump is generally configured for moving higher volumetric flow rates and/or operating a relatively higher (though still sub-atmospheric) pressure. In one example, the first pump 182 maintains a pressure within the processing chamber less than 50 mtorr during a cleaning process. In another example, the first pump 182 maintains a pressure within the processing chamber of about 0.5 mTorr to about 10 Torr. Utilization of a roughing pump during cleaning operations facilitates relatively higher pressures and/or volumetric flow of cleaning gas (as compared to a deposition operation). The relatively higher pressure and/or volumetric flow during the cleaning operation improves cleaning of chamber surfaces.

The second pump 184 may be one a turbo pump and a cryogenic pump. The second pump 184 is utilized during a deposition process. The second pump 184 is generally configured to operate a relatively lower volumetric flow rate and/or pressure. For example, the second pump 184 is configured to maintain the processing region 160 of the process chamber at a pressure of less than about 50 mtorr. In another example, the second pump 184 maintains a pressure within the processing chamber of about 0.5 mtorr to about 10 Torr. The reduced pressure of the processing region 160 maintained during deposition facilitates deposition of a film having reduced compressive stress and/or increased $sp^2$ to $sp^3$ conversion, when depositing carbon-based hardmasks. Thus, process chamber 100 is configured to utilize both relatively lower pressure to improve deposition and relatively higher pressure to improve cleaning.

A valve 186 is utilized to control the conductance path to one or both of the first pump 182 and the second pump 184. The valve 186 also provides symmetrical pumping from the processing volume 160.

The processing chamber 100 also includes a substrate transfer port 185. The substrate transfer port 185 is selectively sealed by an interior door 186A and an exterior door 186B. Each of the doors 186A and 186B are coupled to actuators 188 (i.e., a door actuator). The doors 186A and 186B facilitate vacuum sealing of the processing volume 160. The doors 186A and 186B also provide symmetrical RF application and/or plasma symmetry within the processing volume 160. In one example, at least the door 186A is formed of a material that facilitates conductance of RF power, such as stainless steel, aluminum, or alloys thereof. Seals 116, such as O-rings, disposed at the interface of the spacer 110 and the chamber body 192 may further seal the processing volume 160. A controller 194 coupled to the processing chamber 100 is configured to control aspects of the processing chamber 100 during processing.

The spacer 110 includes a height that provides a volume of the processing volume 160 that is about 0.5 inches to about 20 inches, such as about 0.5 inches to about 3 inches, such as about 10 inches to about 20 inches, such as about 14 inches to about 16 inches. The height of the processing volume 160 provides many benefits. One benefit includes a reduction in film stress which decreases stress induced bow in the substrate being processed therein. The height of the process volume 160 affects plasma density distribution from top to bottom of the processing volume. Methods provided herein provide a predetermined plasma density in the upper portion of the process volume useful for depositing carbon film on portions of chamber components such as portions of the lid 125 by using a top RF source. Moreover, methods provided herein maintain plasma density in the lower portion of the process volume suitable for film deposition on substrate disposed on the substrate support 115 by using a bottom RF source.

Figure 2:
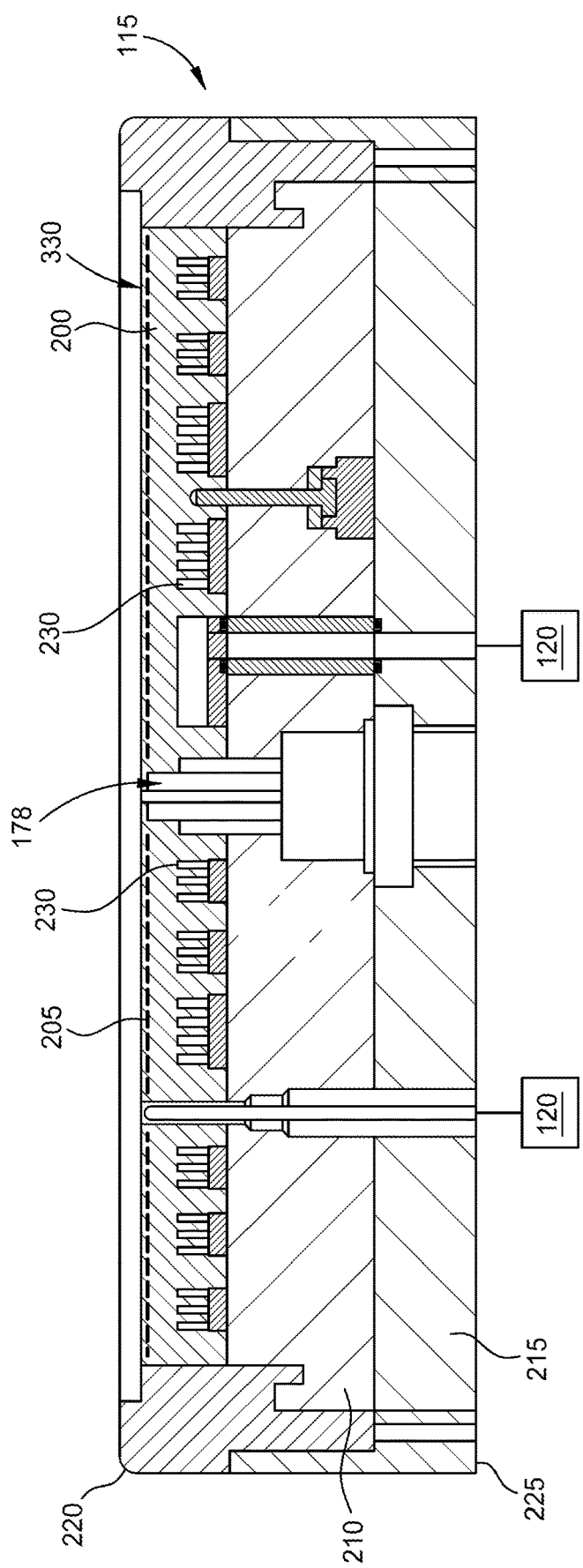
FIG. 2 is a schematic sectional view the substrate support according to an embodiment.

FIG. 2 is a schematic sectional view of one embodiment of the substrate support 115. The substrate support 115 includes an electrostatic chuck 230. The electrostatic chuck 230 includes a puck 200. The puck 200 includes one or more electrodes 205 embedded therein, such as a first electrode and a second electrode. The first electrode is a chucking electrode and the second electrode is an RF biasing electrode. The substrate support 115 may be biased by providing RF power at a frequency of about 300 kHz to about 60 MHz to the second electrode. The frequency provided to the second electrode may be pulsed. The puck 200 is formed from a dielectric material, such as a ceramic material, for example aluminum nitride (AlN).

The puck is supported by a dielectric plate 210 and a base plate 215. The dielectric plate 210 may be formed from an electrically insulative material, such as quartz, or a thermoplastic material, such as high performance plastics sold under the tradename REXOLITE®. The base plate 215 may be made from a metallic material, such as aluminum. During operation, the base plate 215 is coupled to ground or is electrically floating while the puck 200 is RF hot. At least the puck 200 and the dielectric plate 210 are surrounded by an insulator ring 220. The insulator ring 220 may be made of a dielectric material such as quartz, silicon, or a ceramic material. The base plate 215 and a portion of the insulator ring 220 is surrounded by a ground ring 225 made of aluminum. The insulator ring 220 prevents or minimizes arcing between the puck 200 and the base plate 215 during operation. An end of the facilities cable 178 is shown in openings formed in the puck 200, the dielectric plate 210 and the base plate 215. Power for the electrodes of the puck 200, as well as fluids from a gas supply to the substrate support 115, is provided by the facilities cable 178.

An edge ring is disposed adjacent to an inner circumference of the insulator ring 220. The edge ring may comprise a dielectric material, such as quartz, silicon, cross-linked polystyrene and divinylbenzene (e.g., REXOLITE®), PEEK, $Al_2O_3$, AlN, among others. Utilizing an edge ring comprising such a dielectric material helps modulate the plasma coupling, modulating the plasma properties, such as the voltage on the substrate support ($V_{dc}$), without having to change the plasma power, thus improving the properties of the hardmask films deposited on substrates. By modulating the RF coupling to the wafer or substrate through the material of the edge ring, the modulus of the film can be decoupled from the stress of the film.

Figure 3A:
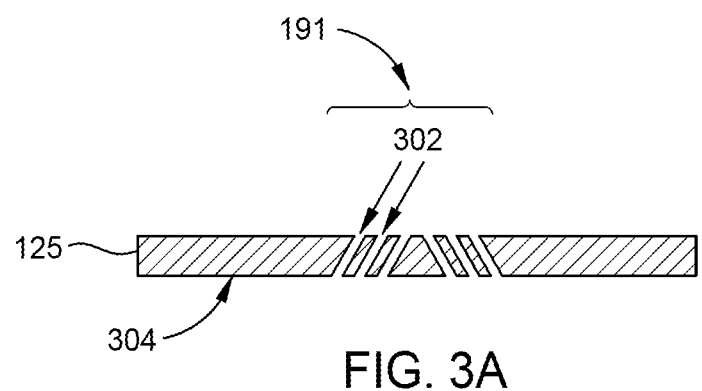
FIG. 3A is an enlarged schematic sectional view of a lid having angled channels according to an embodiment.
Figure 3B:
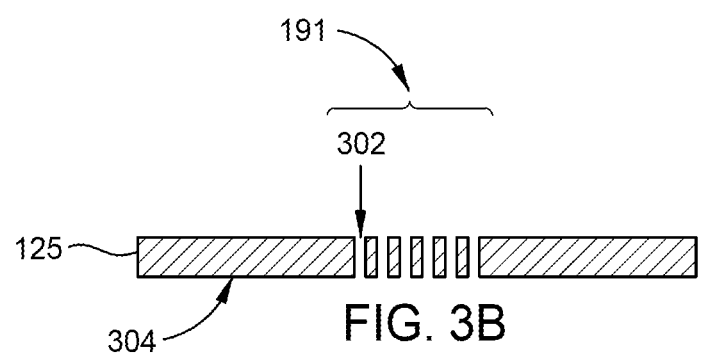
FIG. 3B is an enlarged schematic sectional view of a lid having vertical channels according to an embodiment.

FIGS. 3A and 3B are an enlarged schematic sectional views of the lid 125 shown in FIG. 1. The one or more channels 191 are centrally located within the lid 125 and have angled orientations, depicted as angled channels 302 in FIG. 3A. Alternatively, the one or more channels 191 have substantially vertical channels 302 as depicted in FIG. 3B. Other angles, spacing and orientations are also contemplated.

Figure 4:
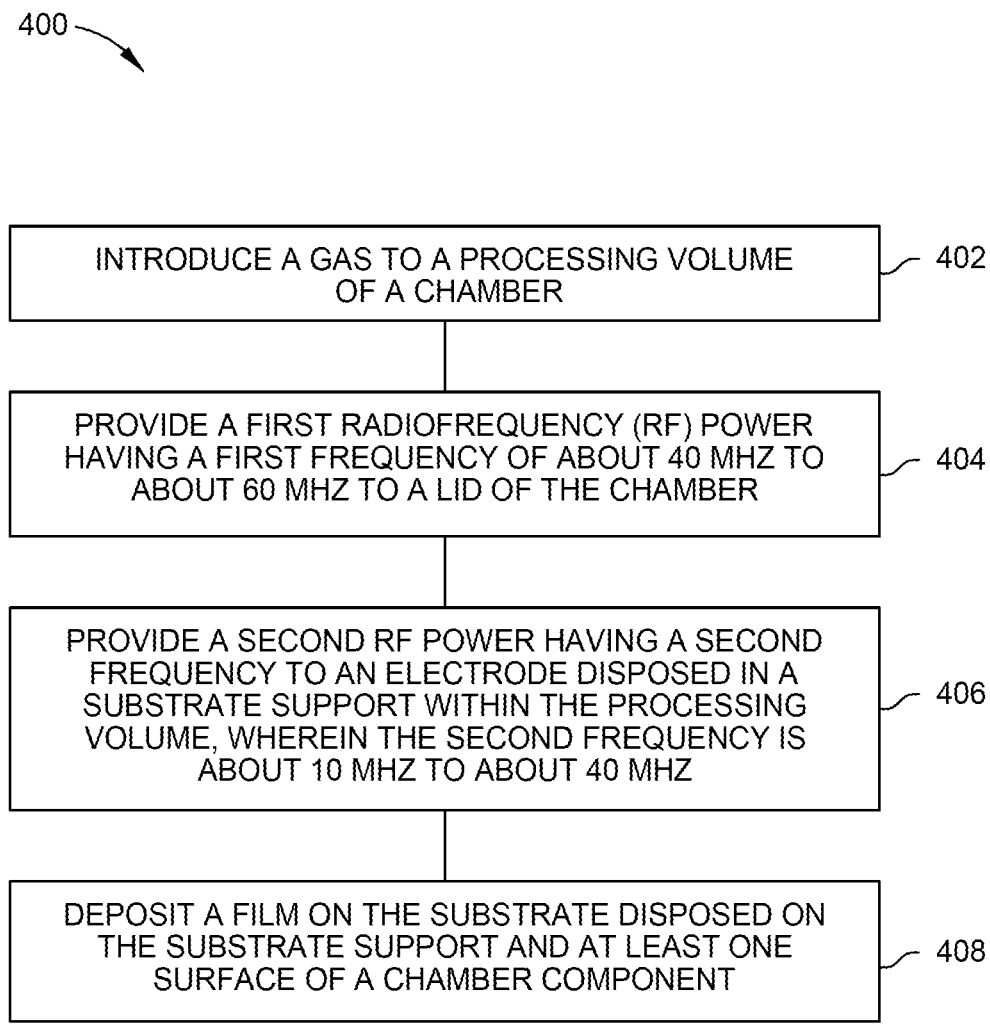
FIG. 4 is a flow diagram of a method for processing a substrate according to an embodiment.

FIG. 4 is a flow diagram of a method for processing a substrate in accordance with an embodiment of the present disclosure. In operation 402, a gas is introduced to a processing volume of a chamber. The gas is a carbon-containing gas such as a hydrocarbon gas, for example, $C_2H_2$. In operation 404, a first radiofrequency (RF) power having a first frequency of about 40 MHz to about 60 MHz, such as about 40 MHz, or about 60 MHz is provided to a lid 125 of the chamber. The first RF source 165 is a top RF source. In operation 406, a second RF power having a second frequency is provided to an electrode disposed in a substrate support within the processing volume. The second frequency is about 10 MHz to about 40 MHz, such as about 13.56 MHz frequency. Additionally, a third RF power is provided to the electrode disposed in the substrate support having a low frequency generator, such as about 400 kHz to about 5 MHz. The first RF source, the second RF source, and/or the third RF source provide power simultaneously and continuously during deposition.

In operation 408, a film having a thickness of about 5 KÅ to about 3 μm, such as about 1 μm to about 2 μm is deposited on the substrate disposed on the substrate support. Additionally, a film is deposited over at least a portion of at least one chamber component, such as the surface 304 of the lid 125. The film is deposited in a single continuous deposition without cleaning between film depositions. In conventional deposition processes, when a carbon film is deposited on a substrate to a thickness greater than 3,000 Å, intermittent cleaning plasmas are used between alternating depositions until the film accrues a desired thickness. Conventional cleaning processes between intermediate layers of the thick carbon film are used to minimize defects in the film and manage film quality on the chamber components. Poor film quality on lid includes increased granularity, non-homogeneity or porosity in the film due to poor cohesion and gap formation with the structure. As the film fails under stress, particles can break away from the film and cause contamination to the substrate. Managing film quality using each additional cleaning process and removal and replacing of the substrate adds to time required to process substrates and negatively affects device yield. Moreover, if cleaning is not done periodically during thick carbon film deposition, the film on the lid 125 exhibits inadequate carbon to carbon cohesion and thus, poor film quality on the lid surface 304. The method 400 described herein, eliminates the need to clean the chamber after each intermediate layer deposited on the substrate. Instead, good quality film is deposited with a thickness of greater than 3,000 Å, such as about 5,000 Å to about 3 μm, such as about 1.5 μm. As used herein, "good quality film" refers to film that is free of stress induced failure, such as cracks.

Without being bound by theory, it is believed that bottom only RF source deposition processes result in poor film quality on the lid surface 304 of chambers having a large gap between the substrate and lid 125. The bottom RF source configuration in a chamber with the large gap results in much weaker plasma density in the upper region of the chamber. Thus, bottom RF source deposition processes deposits film with good quality on the substrate, but the film deposited on the lid surface 304 is of poor quality carbon having columnar feature and porosity which leads to cohesion failures after a certain thickness is deposited. Adding a small amount of high frequency top RF source along with the bottom RF source improves film quality on the lid 125 by increasing the plasma density in the upper portion of the processing volume. In particular, the first RF power source provides about 200 W to about 5 KW, such as about 1 KW to about 3 KW of RF power to the lid 125 during deposition and the second RF power source provides about 1500 W to about 6000 W, such as about 1500 W to about 4000 W of RF power to the electrode.

The dual frequencies described herein, is also suitable for in situ cleaning processes, such as using an oxygen-containing gas to clean the chamber. During cleaning, the first RF source provides about 1 KW to about 3 KW of RF power to the lid and the second RF power source provides about 1500 W to about 6000 W of RF power to the electrode. A top RF source is also suitable for cleaning the upper portions of the processing volume and eliminates the need to clean the volume using a remote plasma source. Similar to the deposition process, the cleaning process of the present disclosure includes a first RF power having a first frequency of about 40 MHz and above is provided to a lid of the chamber. The cleaning process further includes a second RF power having a second frequency provided to an electrode disposed in a substrate support within the processing volume. The second frequency is about 10 MHz to about 20 MHz, such as about 2 MHz frequency from a low frequency generator combined with 13.56 MHz frequency from a second low frequency generator.

While the foregoing is directed to embodiments of the present disclosure, other and further embodiments of the disclosure can be devised without departing from the basic scope thereof, and the scope thereof is determined by the claims that follow.

The invention claimed is:

1. A method for cleaning a chamber, comprising:
introducing a gas to a processing volume of the chamber;
providing a first radiofrequency (RF) power having a first frequency of about 40 MHz or greater to a lid of the chamber;
providing a second RF power having a second frequency to an electrode disposed in a substrate support within the processing volume, wherein the second frequency is about 10 MHz to about 20 MHz; and
removing at least a portion of a film disposed on a surface of a chamber component of the chamber.

2. The method of claim 1, wherein the gas is an oxygen-containing gas.

3. The method of claim 1, wherein providing the first RF power comprises providing about 1 KW to about 3 KW of RF power.

4. The method of claim 1, wherein providing the second RF power comprises providing about 1500 W to about 6000 W of RF power to the electrode.

5. The method of claim 1, wherein a distance from an upper surface of the substrate support to an uppermost inner surface of the lid of the chamber is about 1 inch to about 15 inches.

6. The method of claim 5, wherein the distance is about 5 inches to 6 inches from the lid of the chamber.

7. The method of claim 1, wherein the first RF ionizes the gas in the processing volume of the chamber.

8. The method of claim 7, wherein the first RF is configured to clean an upper portion of the chamber.

9. The method of claim 1, wherein the second frequency is provided from a combination of a first frequency generator and a second frequency generator.

10. The method of claim 9, wherein the first frequency generator provides about 2 MHz frequency.

11. The method of claim 9, wherein the second frequency generator provides about 13.56 MHz frequency.

12. The method of claim 1, wherein a pressure within the processing volume to less than 50 mTorr during the removing.

13. The method of claim 1, wherein a pressure within the processing volume is about 0.5 mTorr to about 10 Torr.

14. A method for cleaning a chamber, comprising:
introducing an oxygen-containing gas to a processing volume of the chamber that has a substrate support therein;
regulating a pressure within the processing volume by a pump;
providing a first radiofrequency (RF) power having a first frequency of about 40 MHz or greater to a lid of the chamber;
removing at least a portion of a film disposed on a surface of a chamber component of the chamber.

15. The method of claim 14, wherein a pressure within the processing volume at less than 50 mTorr during the removing.

16. The method of claim 14, wherein a pressure within the processing volume is about 0.5 mTorr to about 10 Torr.

17. The method of claim 14, wherein a distance from an upper surface of the substrate support to an uppermost inner surface of the lid of the chamber is about 1 inch to about 15 inches.

18. The method of claim 17, wherein the distance is about 5 inches to 6 inches from the lid of the chamber.

19. A method for cleaning a chamber, comprising:
introducing an oxygen-containing gas to a processing volume of the chamber;
regulating a pressure within the processing volume by a pump;
providing a first radiofrequency (RF) power having a first frequency of about 40 MHz or greater to a lid of the chamber;
providing a second RF power having a second frequency to an electrode disposed in the processing volume, the second frequency is a combination of a first frequency generator providing about 2 MHz and a second frequency generator providing about 13.56 MHz frequency;
removing at least a portion of a film disposed on a surface of a chamber component of the chamber.

20. The method of claim 19, wherein first RF power comprises providing about 1 KW to about 3 KW of RF power and the second RF power comprises providing about 1500 W to about 6000 W of RF power to the electrode.

* * * * *